United States Patent [19]
Coleman, Jr.

[11] Patent Number: 6,115,309
[45] Date of Patent: Sep. 5, 2000

[54] SENSE AMPLIFIER HAVING INCREASED DRIVE CURRENT CAPABILITY

[75] Inventor: Donald J. Coleman, Jr., Plano, Tex.

[73] Assignee: Texas Instruments Incorporated, Dallas, Tex.

[21] Appl. No.: 09/324,369

[22] Filed: Jun. 2, 1999

Related U.S. Application Data

[60] Provisional application No. 60/087,750, Jun. 2, 1998.
[51] Int. Cl.[7] ............................................. G11C 7/02
[52] U.S. Cl. ........................................ 365/208; 365/189.11
[58] Field of Search ............................... 365/208, 189.11

[56] References Cited

U.S. PATENT DOCUMENTS

5,801,997  9/1998  Hsieh et al. .................. 365/189.11

*Primary Examiner*—David Nelms
*Assistant Examiner*—M. Tran
*Attorney, Agent, or Firm*—Robby T. Holland; Carlton H. Hoel; Frederick J. Telecky, Jr.

[57] ABSTRACT

A semiconductor memory device sensing circuit (400) is disclosed. The circuit includes a number of sense amplifiers (402), each of which is coupled to a first supply node (414) by a first driver device (P404-0 to P404-n), and to a second supply node (420) by a second driver device (N404-0 to N404-n). An increased driving current capability is provided by a number of first boost capacitors (C400) coupled between the first supply node (414) and an intermediate voltage (Vplate), and a number of second boost capacitors (C402) coupled between the second supply node (420) and the intermediate voltage (Vplate).

20 Claims, 5 Drawing Sheets

SENSE AMPLIFIER HAVING INCREASED DRIVE CURRENT CAPABILITY

This application claims priority under 35 USC §119(e)(1) of provisional application No. 60/087,750 filed Jun. 2, 1998.

TECHNICAL FIELD

The present invention relates generally to semiconductor memory devices, and more particularly to data sensing circuits for semiconductor memory devices.

BACKGROUND OF THE INVENTION

The computing speed and data transfer rates of computer systems continues to increase. In order to provide data at a fast enough rate to such systems, the speed at which memory storage devices operate has also increased. Common types of memory storage devices include semiconductor random access memories (RAM), such as dynamic RAMs (DRAMs) and static RAMs (SRAMs), and read only memories (ROMs), such as electrically erasable programmable ROMs (EEPROMs). RAMs and ROMs having rapid access speeds are thus desirable for high speed systems.

In a typical RAM or ROM, the memory device includes a number of memory cells for storing data. Data within the memory cell can be accessed by a read or write operation (in the case of a RAM), or a read or program operation (in the case of a ROM). In most RAMs and ROMs, a read operation results in memory cells being coupled to bit lines to generate data signals on the bit lines. Because memory cells are usually manufactured as small as possible, the data signals on the bit lines are correspondingly small (i.e., a small current signal or small voltage differential). In order to translate the such small data signals into output data signals, the memory cell data signals must first be amplified. Such amplification operations are often referred to as "sensing" and are performed by amplifying circuits referred to as sense amplifiers. Because memory cell data signals must first be sensed before they are output, the speed at which data can be sensed plays an important role in the overall access speed of a semiconductor memory device.

In order to sense data, sense amplifiers typically charge or discharge a bit line (or bit line pair) according to the memory cell data value. In order to charge the relatively large capacitive load presented by a bit line, a sense amplifier will draw current from the power supply. The maximum current drawn by the sense amplifiers during a sense operation is referred to as a peak current. While high peak currents are undesirable, due to their resulting power consumption and noise generation, the ability of RAM or ROM to provide a high peak current can lead to faster sensing times.

In addition to amplifying memory cell data signals to generate output signals, sensing operations also play an important role in DRAMs. DRAM memory cells typically store data values by charging a storage charge capacitor situated within each memory cell. Because stored can leak out over time, the charge within such a capacitor must be refreshed in order to preserve in the data value. Thus, when a sense operation charges a bit line, the associated storage capacitor will also be charged, refreshing the data value stored within.

Figure 1:
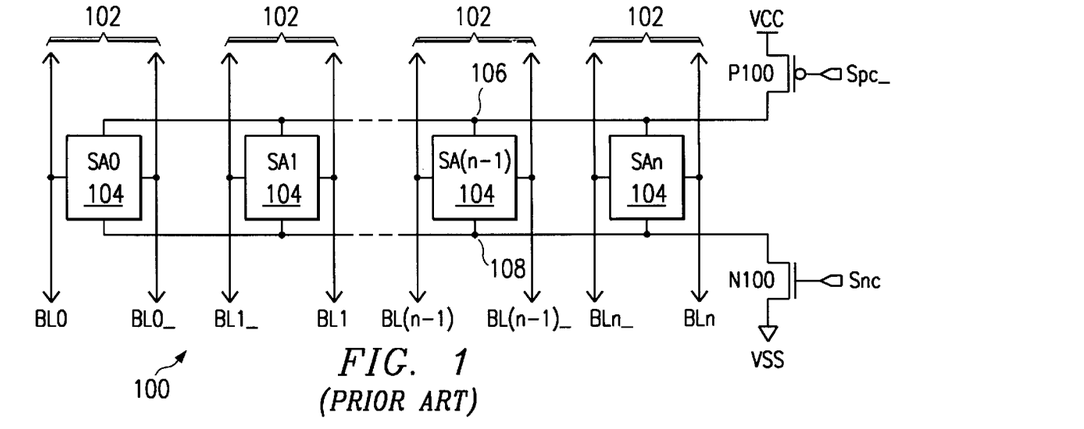
FIG. 1 is a block schematic diagram illustrating a first prior art sensing arrangement.

Referring now to FIG. 1, a prior art sensing arrangement is set forth in block schematic diagram. The sensing arrangement is designated by the general reference character 100, and illustrates a portion of a RAM having "folded" bit lines. In such an arrangement, the bit lines are grouped into bit line pairs 102. The sensing arrangement of FIG. 1 includes n+1 bit line pairs, labeled as BL0/BL0_ to BLn-BLn_. Each bit line pair (BL0/BL0_ to BLn/BLn_) is coupled to an associated sense amplifier 104. The sense amplifiers are shown as SA0–SAn. Each of the sense amplifiers 104 is commonly coupled to a first power supply line 106 and a second power supply line 108. The first power supply line 106 is coupled to a high power supply voltage VCC by a p-channel metal-oxide-semiconductor (MOS) sense transistor P100. In a similar fashion, the second power supply line 108 is coupled to a low power supply voltage VSS by an n-channel MOS sense transistor N100. Transistor P100 is activated by a first sense amplifier enable signal, shown as Spc_. Transistor N100 is activated by a second sense amplifier enable signal, shown as Snc.

In a read operation, a row of memory cells is coupled to the bit line pairs 102, creating differential voltage signals thereon. The sense amplifiers 104 are then activated, by turning on transistors P100 and N100, supplying the power supply voltages VCC and VSS to the first and second power supply lines (106 and 108), respectively. The activation of the transistors P100 and N100 results in a current pulse, which propagates along the first power supply line 106, starting at the drain of transistor P100, and ending at sense amplifier SA0. The sense amplifiers 104 will not be able to charge a bit line in their respective pairs 102 until the current pulse is received. In this manner, the speed at which a power supply current is provided to a sense amplifier effects the speed of the overall memory device.

Figure 2:
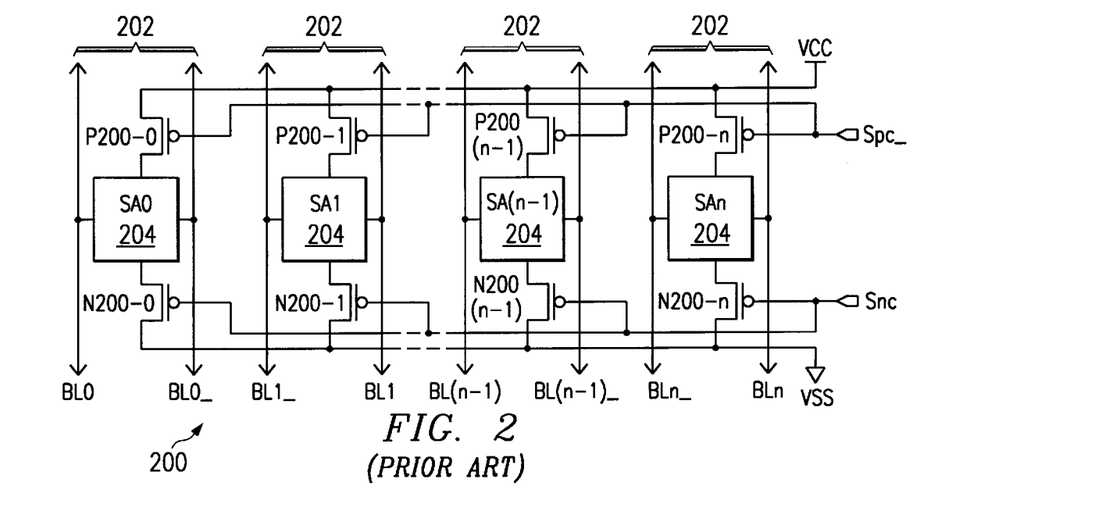
FIG. 2 is a block schematic diagram illustrating a second prior art sensing arrangement.

Referring now to FIG. 2, a second sense arrangement is set forth in a block schematic diagram. The second arrangement is designated by the general reference character 200, and is shown to include many of the same structures as the first sense arrangement 100, set forth in FIG. 1. The second arrangement 200 includes a number of bit line pairs 202, shown as BL0/BL0_ to BLn/BLn_, each coupled to a sense amplifier 204. The sense amplifiers 204 are labeled SA0–SAn. Unlike the first arrangement 100, in the second arrangement 200, each sense amplifier 204 has an associated p-channel and n-channel MOS sense transistor. The p-channel sense transistors are shown as P200-0 to P200-n, and correspond to sense amplifiers SA0–SAn, respectively. The n-channel sense transistors are shown as N200-0 to N200-n, and are connected to sense amplifiers SA0–SAn, respectively.

The second sense arrangement 200 operates in a similar fashion to the first arrangement. Memory cells place data on the bit line pairs 202, and the sense amplifiers 204 are activated to sense the data signals. Sense amplifier activation occurs by the Spc_ signal going low and the Snc signal going high. The high power supply voltage VCC is coupled to the sense amplifiers 204 by way of transistors P200-0 to P200-n, and the low power supply voltage VSS is coupled to the sense amplifiers 204 by way of transistors N200-0 to N200-n. The second arrangement 200 can provide for faster sensing speeds, as the speed of the sense operation depends upon the propagation of the Spc_ and Snc signals along the gates of transistors P200-0 to P200-n and N200-0 to N200-n. The speed of the Spc_ and Snc signals is faster than the propagation of current pulse along the first power supply line 106 in the arrangement of FIG. 1. Speed is also increased as each of the transistors P200-0 to P200-n can be sized to provide more current to their respective sense amplifiers 204, than in the case of the first arrangement 100. A drawback to the second arrangement 200 is that the peak current drawn by the sense amplifiers 204 may be considerable.

Figure 3:
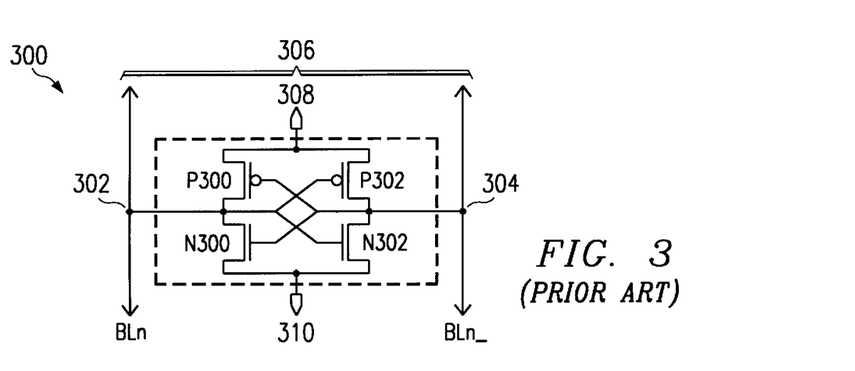
FIG. 3 is a schematic diagram illustrating a prior art sense amplifier.

FIG. 3 illustrates a prior art sense amplifier that may be used as the sense amplifiers 104 in FIG. 1, or sense amplifiers 204 in FIG. 2. The sense amplifier is designated by the general reference character 300, and is shown to include a first complementary pair of p-channel and n-channel transistors (P300 and N300) which have their source-drain paths arranged in series. The sense amplifier 300 includes a second pair of complementary transistors P302 and N302, having their source drain paths arranged in series. The complementary pairs P300/N300 and P302/N302 are cross-coupled, with the gates transistors P300 and N300 being coupled to the common drains of the transistors P302/N302 and vice versa. The common drains of transistors P300/N300 form a first sense node 302. The common drains of transistors P302/N302 form an opposing second sense node 304. The first and second sense nodes (302 and 304) are coupled between a bit line pair 306. The bit lines of the bit line pair 306 are shown as BLn and BLn__. The sources of transistors P300 and P302 are commonly connected to first power supply node 308, and the sources of transistors N300 and N302 are commonly coupled to a second power supply node 310.

The sense amplifier 300 is activated by applying a high power supply voltage to the first supply node 308, and a low power supply voltage to the second power supply node 310. When activated, the sense amplifier 300 will drive its sense nodes (302 and 304) to opposite potentials according to the differential voltage on the bit line pair 306. For example, in the event the differential voltage results in bit line BLn being higher in potential than bit line BLn__, when the sense amplifier 300 is activated, transistor P300 will pull the first sense node 302 to the high power supply voltage, and transistor N302 will pull the second sense node 304 to the low power supply voltage.

It would be desirable to provide a sensing scheme for RAMs and/or ROMs that provides for rapid sensing of data signals, but does not suffer from the drawbacks of the prior art.

SUMMARY OF THE INVENTION

According to the preferred embodiment, a semiconductor random access memory (RAM) includes a plurality of sense amplifiers. Each sense amplifier is activated by an associated first driver device that couples the sense amplifier to a first supply node. The first supply node is coupled to a first power supply voltage. An increased current supply for the sense amplifiers is provided by a number of first boost capacitors coupled between the first supply node and an intermediate voltage.

According to one aspect of the preferred embodiment, each sense amplifier is further activated by an associated second driver device that couples the sense amplifier to a second supply node. The second supply node is coupled to a second supply voltage. The current supply for the sense amplifiers is further increased by a number of second boost capacitors coupled between the second supply node and an intermediate voltage.

According to another aspect of the preferred embodiment, the RAM is a dynamic RAM (DRAM) having a number of memory cells, each of which includes a storage capacitor. The boost capacitors, which provide increased current to the sense amplifiers, are formed at the same time as the storage capacitors.

According to another aspect of the preferred embodiment, the RAM is a DRAM with the storage capacitors of the DRAM memory cells each having a first plate and a second plate. The second plates of the memory cells are commonly coupled to a plate potential that is approximately midway between a high power supply voltage and a low power supply voltage. The intermediate voltage supplied to the boost capacitors is equal to the plate potential.

An advantage of the preferred embodiment is that it utilizes the same process used to produce memory cell storage capacitors to produce boost capacitors for supplying increased current to the sense amplifiers.

DETAILED DESCRIPTION OF THE EMBODIMENTS

The preferred embodiment is a sensing scheme for amplifying memory cell data on a number of bit line pairs. The preferred embodiment is intended for use in a dynamic random access memory (DRAM) and is implemented using complementary metal(conductor)-oxide(dielectric)-semiconductor technology. The preferred embodiment provides for rapid sensing of memory cell data by employing driving devices, associated with each sense amplifier, for coupling the sense amplifier directly between a high power supply voltage node and a low power supply voltage node. High peak currents can be accommodated by boost capacitors having one plate coupled to a power supply voltage node, and another plate coupled to an intermediate voltage node.

Figure 4:
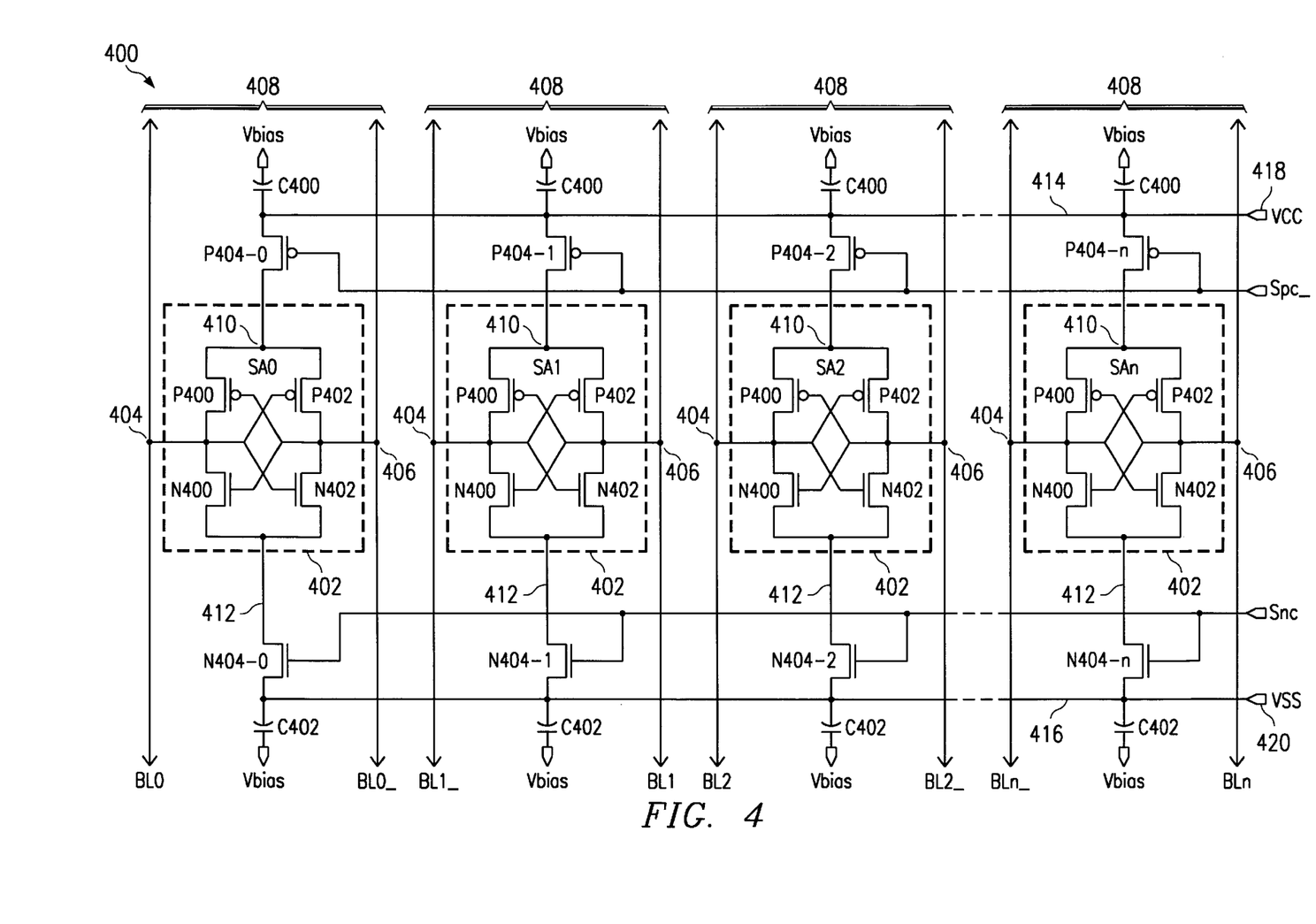
FIG. 4 is a schematic diagram of the preferred embodiment.

Referring now to FIG. 4, the preferred embodiment is designated by the general reference character 400 and is shown to include a number of sense amplifiers 402 arranged in a row to form a bank. The sense amplifiers are identified as SA0–SAn, indicating the sensing arrangement includes a bank of "n+1" sense amplifiers. Each sense amplifier 402 has the same configuration as that of the prior art sense amplifier 300, illustrated in FIG. 3. Thus, each sense amplifier in FIG. 4 includes a complementary pair of p-channel and n-channel transistors (P400 and N400) cross-coupled with a second complementary pair of transistors (P402 and N402). The common drains of the complementary transistor pairs (P400/N400 and P402/N402) form first sense nodes 404 and second sense nodes 406, respectively. Each sense amplifier 402 is coupled to a pair of bit lines 408 at its first and second sense nodes (404 and 406). The bit line pairs 404 are further identified in FIG. 4 as BL0/BL0__ to BLn/BLn__.

The utilization of CMOS sense amplifiers 402 in the preferred embodiment 400 provides for low quiescent current consumption, and thus lower power consumption in a stand-by state (a state in which the sense amplifiers are not activated).

Power is supplied to each sense amplifier 402 at an associated first supply node 410 and second supply node

412. A high power supply voltage VCC is provided at a first common supply node 414, and applied to the first supply node 410 of each sense amplifier 402 by an associated first driver device. In the preferred embodiment 400, the first driver devices are p-channel MOS transistors, shown as P404-0 to P404-n, which are associated with sense amplifiers SA0–SAn, respectively. The gates of the first driver transistors P404-0 to P404-n are commonly driven by a first sense amplifier enable signal, shown as Spc__.

In a generally complementary fashion to the first driver devices, a low power supply voltage VSS is applied at a second common supply node 416, and coupled to the second supply nodes 412 of the sense amplifiers 402 by second driver devices. In the preferred embodiment 400, the second driver devices are n-channel MOS transistors, shown as N404-0 to N404-n, and are associated with sense amplifiers SA0–SAn, respectively. The gates of the second driver transistors N404-0 to N404-n are commonly coupled to a second sense amplifier enable signal, shown as Snc.

In order to provide additional current supply capabilities, the preferred embodiment 400 includes a number of first boost capacitors C400 coupled between the first common supply node 414 and a bias voltage, shown as Vbias. In addition, a number of second boost capacitors C402, are coupled between the second common supply node 416 and the bias voltage Vbias. In the preferred embodiment 400, the Vbias voltage has a potential that is between the high power supply voltage VCC and the low power supply voltage VSS.

It is noted that while the first and second boost capacitors (C400 and C402) are shown coupled to the sources of the driver transistors (P404-0 to P404-n and N404-0 to N404n) the invention should not be construed as being limited to such an arrangement. The number and connection location of boost capacitors could be varied according to desired additional drive current, or in response to design constraints, such as available area and suitable contact location, to name just a few.

In a read or refresh operation, a memory cell is coupled to one bit line of a bit line pair 408 resulting in a differential voltage on the bit line pairs. For example, in the event a memory cell storing a logic "1" was coupled to bit line BL0, the potential of bit line BL0 would rise above that of the other bit line in the pair (BL0__).

Once differential voltages are established on the bit line pairs 408, the sense amplifiers 402 are enabled by the Spc signal going low and the Snc signal going high. The low Spc signal results in the first driver transistors (P410-0 to P410-n) being turned on, and the first supply nodes 410 of each sense amplifier 402 being coupled to the first common supply node 414. The high Snc signal turns on the second driver transistors (N410-0 to N410-n), resulting in the second supply nodes 412 of each sense amplifier 402 being coupled to the second common supply node 416. According to the differential voltage on each bit line pair 408, the first driver transistors (P400-0 to P400-n) will supply current to one bit line of each bit line pair, while the associated second driver transistor (N400-0 to N400-n) will sink current from the other bit line of each bit line pair. For example, if memory cell data resulted in bit line BL0 being at a higher potential than bit line BL0__, the enabling of sense amplifier SA0 would result in first driver transistors P400-0 supplying current to bit line BL0, while second driver transistor N404-0 would sink current from bit line BL0__.

The simultaneous activation of the sense amplifiers 402 results in a relatively high amount of current being drawn from the first common supply node 414. However, due to the charge stored within the parallel arrangement of boost capacitors (C400 and C402), the current supply is above and beyond that which would normally be available from the high and low power supply sources (418 and 420). In this manner, the preferred embodiment 400 provides faster sensing speeds while at the same time accommodating the resulting increased peak current.

Figure 5:
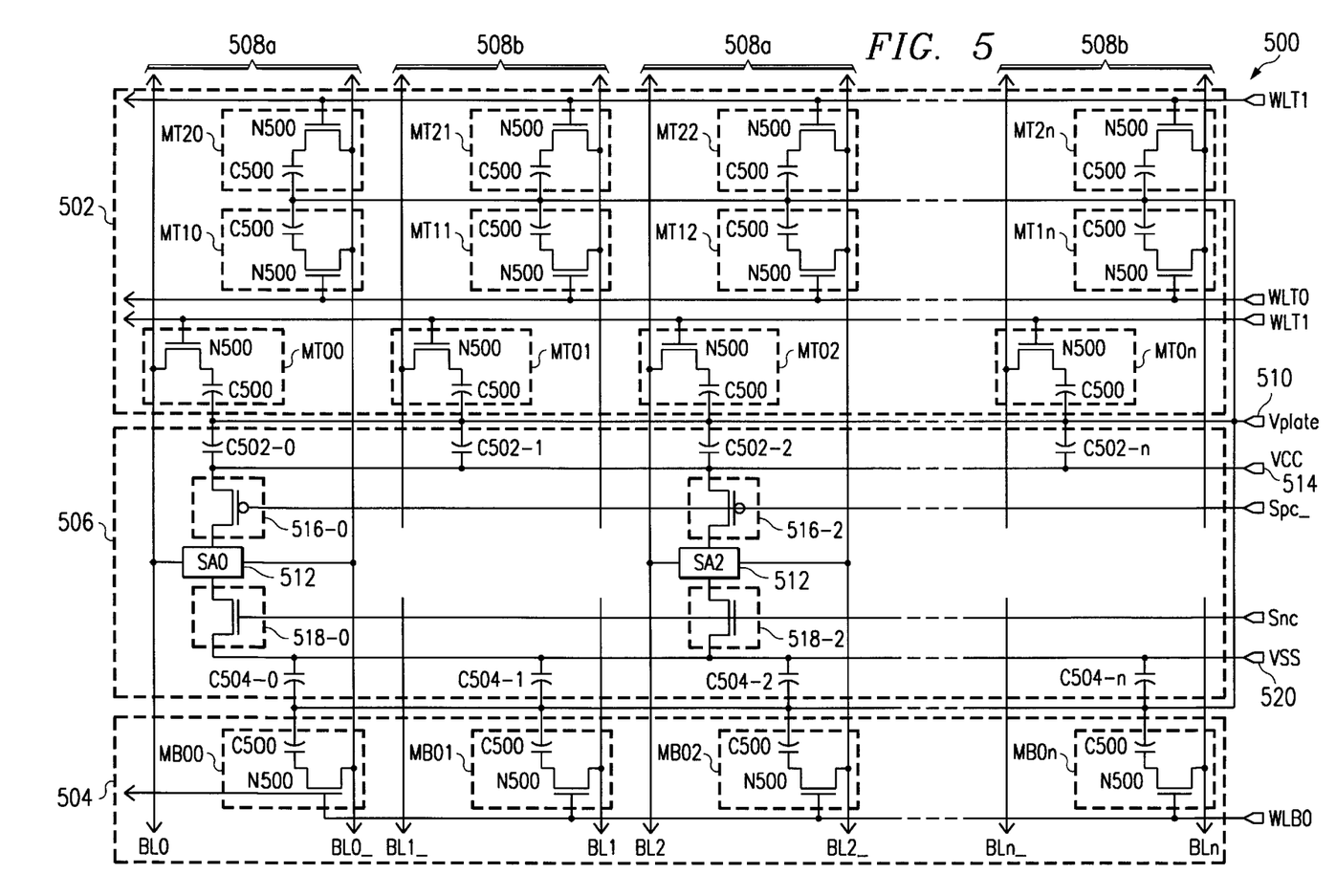
FIG. 5 is a block schematic diagram illustrating a DRAM sensing scheme according to the preferred embodiment.

Referring now to FIG. 5, a block schematic diagram is set forth, illustrating DRAM sensing scheme according to the preferred embodiment. The sensing scheme is designated by the general reference character 500, and is shown to include a portion of a top memory cell array 502, a portion of a bottom memory cell array 504, and a current boosted sense amplifier bank 506. The top memory cell array 502 includes a number of DRAM memory cells, shown as MT00–MT2n. The two digits following the "M" represent the row and column location of the memory cell. The portion of the bottom memory cell array 504 set forth in FIG. 5 includes one row of memory cells, shown as MB00–MB0n.

Each memory cell includes an n-channel MOS pass transistor N500 and a storage capacitor C500. The pass transistors N500 of the same row are commonly coupled to a word line by their respective gates, and the pass transistors N500 of the same column are commonly coupled to either an even bit line pair 508a or an odd bit line pair 508b. The bit line pairs (508a and 508b) are further identified in FIG. 5 as BL0/BL0__ to BLn/BLn__. In the preferred embodiment DRAM arrangement 500, the memory cells within the same column are alternately coupled to opposite bit lines of a bit line pair. Further, all but the last memory cells in a column share a bit line contact. Therefore, every two memory cells within the same column are connected to the same bit line of their respective bit line pair. For example, as shown in FIG. 5, memory cell MT00 is coupled to bit line BL0, while memory cells MT20 and MT10 are coupled to bit line BL0__. It is understood that the next two memory cells above MT20 would be designated MT30 and MT40, and would be coupled to bit line BL0.

In the preferred embodiment 500, the storage capacitors C500 each include a first plate coupled to the drain of a pass transistor, and a second plate, coupled to a plate node 510. The plate node 510 is maintained at a plate voltage, shown as Vplate. Each memory cell stores data by charging or discharging its first plate. For example, in order to store a logic "1" the first plate is charged a high array voltage, VCC. To store a logic "0" the first plate is discharged to a low array voltage, VSS. In order to minimize the electric field across the storage capacitors C500, the Vplate voltage is maintained midway between the VCC and VSS potential. In the preferred embodiment 500, VSS is equal to zero volts, and thus the Vplate potential is equal to VCC/2.

Referring once again to FIG. 5, the sense amplifier bank 506 is shown to include a number of sense amplifiers 512 coupled to the even bit line pairs 508a. In the preferred embodiment 500, the odd bit line pairs 508b are coupled to sense amplifier banks (not shown) at opposite ends of the memory arrays (502 and 504). This arrangement allows for greater area to be dedicated to the sense amplifiers. The sense amplifiers 512 are further identified in FIG. 5 as SA0 and SA2.

Each sense amplifier 512 is coupled to a high array voltage node 514 by an associated first driver device 516-0 and 516-2. As in the embodiment set forth in FIG. 4, in the preferred embodiment DRAM sensing scheme 500, the first driver devices (516-0 and 516-2) are p-channel MOS transistors having source-drain paths coupled between their associated sense amplifier 512 and the high array voltage node 514. The gates of the first driver devices (516-0 and 516-2) commonly receive a first sense amplifier enable signal Spc_. Second driver devices (518-0 and 518-2) couple each sense amplifier 512 to a low array voltage node 520. In the preferred embodiment DRAM sensing scheme 500, the second driver devices (518-0 and 518-2) are n-channel MOS transistors having source-drain paths coupled between their respective sense amplifiers (SA0 and SA2) and the low array voltage node 520. The gates of the transistors receive a second sense amplifier enable signal, Snc.

A boosted sense current capability is provided by first boost capacitors (C502-0 to C502-n) coupled between the high array voltage node 514 and the plate node 510. In the preferred embodiment DRAM sensing scheme 500, the first boost capacitors (C502-0 to C502-n) are formed at the same time the storage capacitors C500 are formed. That is, the first boost capacitors (C502-0 to C502-n) will be formed from the same deposited layers as the storage capacitors C500. The conductive layers (which form capacitor plates) and dielectric layer (that forms the capacitor dielectric) will be patterned to simultaneously create the storage capacitor C500 and first boost capacitor (C502-0 to C502-n) structures. This provides for easy incorporation of the first boost capacitors (C502-0 to C502-n) into existing DRAM manufacturing processes. Furthermore, by maintaining one plate of each first boost capacitor (C502-0 to C502-n) at the VCC potential, and the other plate at the Vplate potential, the field across the first boost capacitor dielectric is reduced (as opposed to maintaining the capacitor plates at the full high and low voltage levels).

It is understood that although the first boost capacitors (C502-0 to C502-n) are formed in conjunction with the storage capacitors C500, the first boost capacitors (C502-0 to C502-n) may be larger than the storage capacitors C500. Furthermore, while FIG. 5 shows the first boost capacitors being formed within each column of memory cells, the number of first boost capacitors can be reduced if a sufficient current boost can be maintained with a lesser number of boost capacitors.

It is also understood that while the preferred DRAM embodiment 500 utilizes a high power supply potential VCC to drive the high array voltage node 514, the VCC potential could be less than the power supply voltage received by the DRAM. For example, the DRAM may utilize a reduced voltage array, in which the high voltage of the array is less than that of the peripheral portions of the DRAM. In such a case, the potential at the high array voltage node 514 would be the reduced array voltage. Provided the VSS potential was equal to zero volts, in such a case, the Vplate potential would be half of the reduced array voltage.

In the preferred embodiment DRAM arrangement 500, a set of second boost capacitors are manufactured along with the first boost capacitors (C502-0 to C502-n) and the storage capacitors C500. These additional capacitors are shown as second boost capacitors (C504-0 to C504-n), and are coupled between the plate node 510 and the low array voltage VSS. The second boost capacitors (C504-0 to C504-n) may have the same dimensions as the storage capacitors C500, or may be larger or smaller, according to the desired current boost capability. In this manner, increased sensing current along with a corresponding sense current boost capability can be particularly advantageous when employed in a DRAM.

Figure 6A:
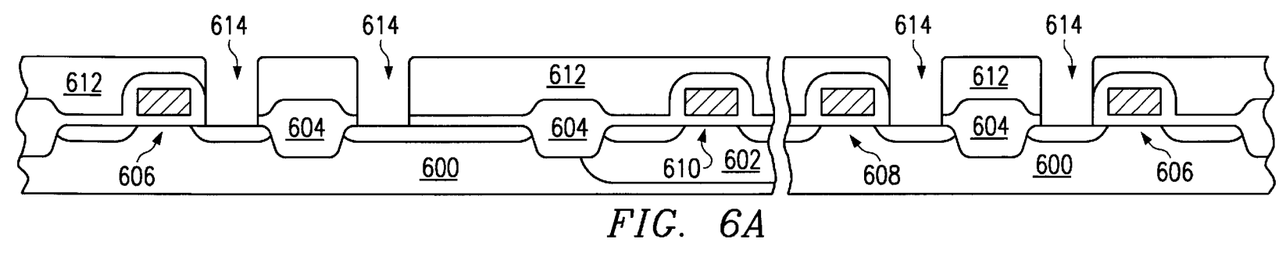
FIGS. 6A–6F are side cross-sectional views illustrating the fabrication of boost capacitors according to the preferred embodiment.

Referring now to FIGS. 6A to 6F, a series of side cross-sectional views are set forth illustrating a portion of a DRAM semiconductor memory device. The side-cross sectional views illustrate the fabrication of boost capacitor devices according to the preferred embodiment. Referring now to FIG. 6A, the DRAM is shown to be formed on a p-type semiconductor substrate 600 with an n-type well 602 formed therein. The substrate 600 is divided into active areas created by the formation of field oxide structures 604.

MOS transistors shown formed within the active areas, can be considered to correspond to transistors shown in FIG. 5. N-channel MOS memory cell pass transistors 606 may correspond to transistors N500. N-channel MOS driver transistor 608 may correspond to second driver devices 518-0 and 518-2. Finally, p-channel MOS driver transistor 610, formed within the n-type well 602, may correspond to first driver devices 516-0 and 516-2. A dielectric layer 612 formed over the various transistors (606, 608 and 610) includes contact holes 614 that extend through the dielectric layer 612 to the transistors (606, 608 and 610).

Figure 6B:
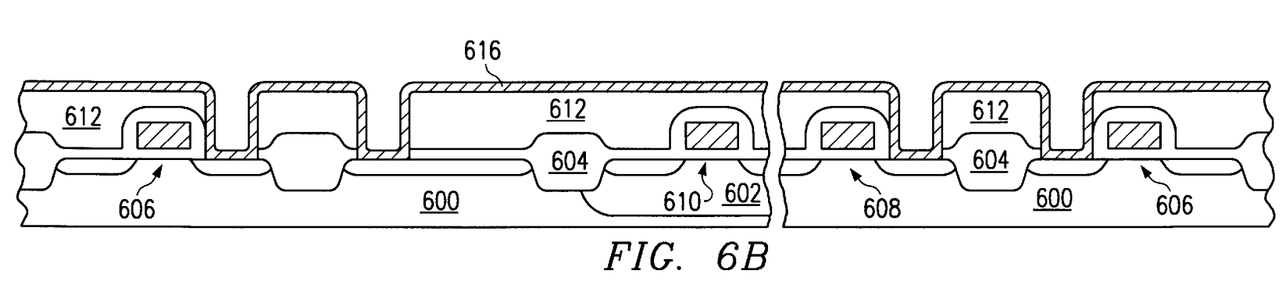

As set forth in FIG. 6B, a first plate conductive layer 616 is deposited over the dielectric layer 612. The first plate conductive layer 616 extends into the contact holes 614 and makes contact with the drains of the pass transistors 606, and the source of the n-channel drive transistor 608. In the preferred embodiment, the first plate conductive layer 616 is formed from doped polysilicon.

Figure 6C:
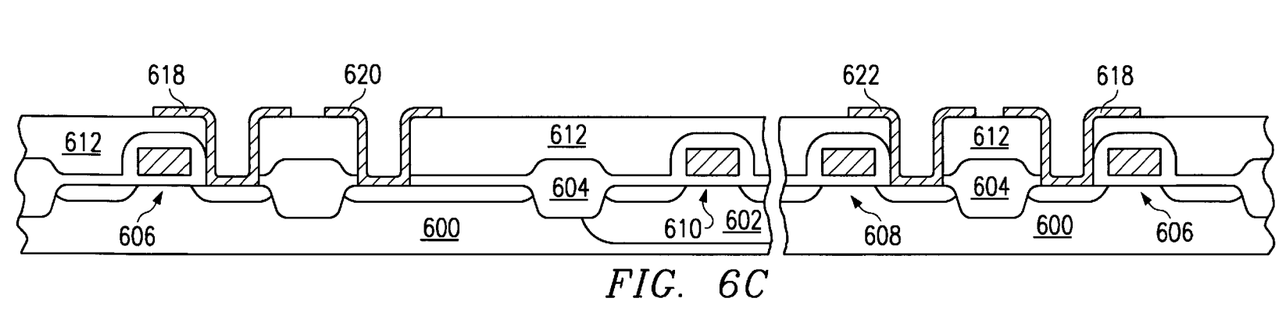

Referring now to FIG. 6C, the first plate conductive layer 616 is patterned to form a number of individual bottom capacitor plates. Storage capacitor bottom plates 618 are formed, which will be later coupled to the pass transistors 606. Similarly, a first boost capacitor bottom plate 620 is formed coupled to the p-channel driver transistor 610, and a second boost capacitor bottom plate 622 is formed coupled to the n-channel driver transistor 608.

Figure 6D:
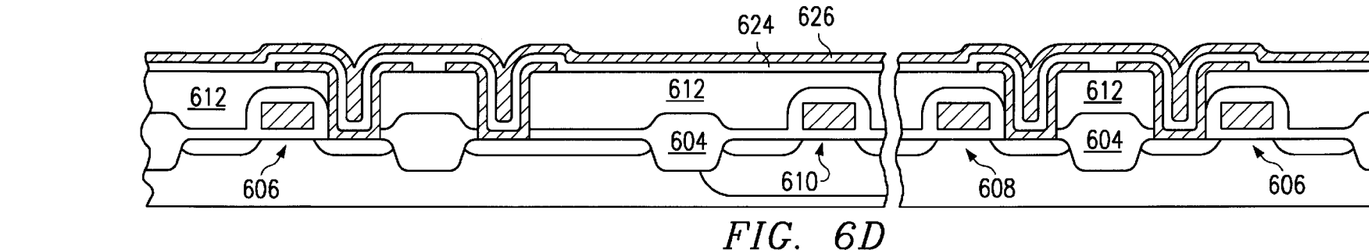

As shown in FIG. 6D, a capacitor dielectric 624 is formed over the capacitor bottom plates (618, 620 and 622). In the preferred embodiment, the capacitor dielectric 624 is formed by depositing a layer of silicon nitride, oxidizing the capacitor bottom plates (618, 620 and 622). The resulting oxide layer may then be covered with a layer of silicon nitride, deposited by chemical vapor deposition. A layer of native or intentional oxide may reside at the interface between the nitride and capacitor bottom plate. The silicon nitride may then be oxidized. A second plate conductive layer 626 is deposited over the capacitor dielectric 624. The second plate conductive layer 626 may be formed from doped polysilicon.

Figure 6E:
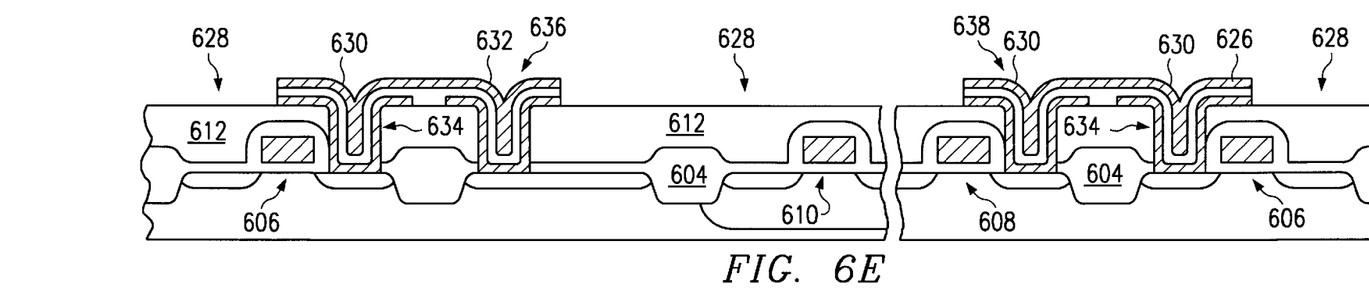

FIG. 6E shows the DRAM cross section following a patterning step, which creates a number of openings 628 that extend through the second plate capacitor layer 626. The openings are created to allow other higher level contacts to extend through the second plate capacitor layer 626 to structures below. Thus, it is understood that while the cross section of FIG. 6E shows the second plate capacitor layer 626 as divided into two different sections, the second plate capacitor layer 626 remains an integral structure that runs together at a different locations not shown in the cross sectional view. In the preferred embodiment, the patterning step can be accomplished with reactive ion etching.

The second plate capacitor layer 626 serves to provide a top plate for each of the various bottom plates (618, 620 and 622). Further, because the second plate capacitor layer 626 is coupled to a reference voltage (Vplate in the case of FIG. 5), the integral second plate capacitor layer 626 can be conceptualized as including first reference plate portions 630 (which serve as opposing capacitor plates to the storage capacitor bottom plates 618) and second reference plate portions 632 (which serve as opposing capacitor plates to the boost capacitor bottom plates 620 and 622).

The patterning of the second plate capacitor layer 626 completes the formation of storage capacitors 634, a first boost capacitor 636, and a second boost capacitor 638. Referring to FIG. 6E in conjunction with FIG. 5, the storage capacitors 634 can be considered to correspond to storage capacitors C500, the first boost capacitor 636 corresponds to first boost capacitors (C502-0 to C502-n), and the second boost capacitor 638 corresponds to second boost capacitors (C504-0 to C504-n).

Figure 6F:
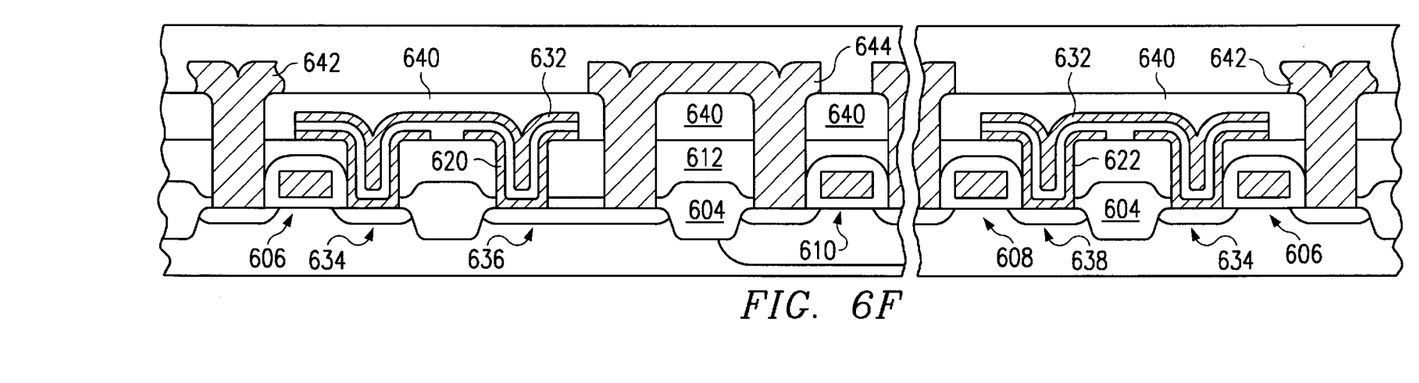

FIG. 6F illustrates the DRAM following a contact etch and metallization step. A first interlayer dielectric (ILD) 640 is created over the capacitors (634, 636 and 638). Contact holes are then etched through to the substrate 600 diffusion regions. A metallization layer is deposited and subsequently patterned to create bit lines 642 and a capacitor-to-drive transistor connection 644. The bit lines 642 correspond to bit line pairs 508a and 508b in FIG. 5. The connection 644 provides a conductive path between the first boost capacitor 636 and the p-channel driver transistor 610. The connection 644 could be created by extending the first boost capacitor 620 beyond the second reference plate portion 632, to provide a landing area for a connection contact (as opposed to a contact that extends to the substrate).

It is noted that the bit lines 642 are not necessarily aligned with the connection 644 in the cross sectional plane, but is included to illustrate the structure of the preferred embodiment boost capacitors (636 and 638).

It is understood that while the preferred embodiment illustrates a DRAM having stacked cell capacitors (a capacitor formed by alternating conductive and dielectric layers formed above the substrate), DRAMs employing different capacitor structures could benefit from the teachings of the preferred embodiment. As just a few examples, although the cross-section of FIGS. 6A–6F show a bit line-over-capacitor arrangement, DRAMs employing capacitor-over-bit line structures could create boost capacitors along with storage capacitors. Similarly, in the event a DRAM utilizes trench-type capacitors, boost capacitors having the trench-type structure could be formed at the same time as storage capacitors. Thus, while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. A semiconductor memory device data sensing circuit, comprising:
    a plurality of sense amplifiers;
    a first common supply node coupled to a first sense supply voltage;
    an intermediate voltage node necessarily less than the first sense supply voltage;
    a first driver device associated with each sense amplifier, each first driver device coupling its associated sense amplifier to the first common supply node when activated; and
    at least one first boost capacitor coupled between the first common supply node and the intermediate voltage node that can increase the power supply charge to at least one sense amplifier.

2. The data sensing circuit of claim 1, wherein:
    each sense amplifier includes
        a first complementary pair of transistors having a p-channel insulated gate field effect transistor (IGFET) coupled in series with a first n-channel IGFET,
        a second complementary pair of transistors having a second p-channel IGFET coupled in series with a second n-channel IGFET, and
    the first complementary pair being cross-coupled with the second complementary pair.

3. The data sensing circuit of claim 1, wherein:
    the semiconductor memory device receives a first power supply voltage; and
    the first sense supply voltage is less than the first power supply voltage.

4. The data sensing circuit of claim 1, wherein:
    the semiconductor memory device receives a first power supply voltage; and
    the first sense supply voltage is equal to the first power supply voltage.

5. The data sensing circuit of claim 1, wherein:
    each first driver device includes an IGFET having a source-drain path coupled between its associated sense amplifier and the first common supply node.

6. The data sensing circuit of claim 1, wherein:
    a plurality of first boost capacitors are coupled between the first common supply node and the intermediate voltage node.

7. The data sensing circuit of claim 6, wherein:
    the semiconductor memory device is a dynamic random access memory device having a plurality of memory cells that include a storage capacitor; and
    the first boost capacitors are commonly formed with the storage capacitors.

8. The data sensing circuit of claim 1, further including:
    a second common supply node coupled to a second sense supply voltage, the second sense supply voltage being less than the first sense supply voltage;
    a second driver device associated with each sense amplifier, each second driver device coupling its associated sense amplifier to the second common supply node when activated; and
    at least one second boost capacitor coupled between the second common supply node and the intermediate voltage node.

9. The data sensing circuit of claim 8, wherein:
    each second driver device includes an IGFET having a source-drain path coupled between its associated sense amplifier and the second common supply node.

10. The data sensing circuit of claim 9, wherein:
    each first driver device includes a p-channel IGFET having a source-drain path coupled between its associated sense amplifier and the first common supply node; and,
    the second driver device IGFETs are n-channel IGFETs.

11. The data sensing circuit of claim 8, wherein:
    the semiconductor memory device receives a second power supply voltage; and
    the second sense supply voltage is equal to the second power supply voltage.

12. The data sensing circuit of claim 11, wherein:
    the semiconductor memory device is a dynamic random access memory having a plurality of memory cells that include a storage capacitor; and
    the second boost capacitors are commonly formed with the storage capacitors.

13. A sensing scheme for a semiconductor memory device, the sensing scheme comprising:
- a plurality of memory cells;
- a plurality of bit lines coupled to the memory cells;
- a plurality of sense amplifiers coupled to the bit lines, each sense amplifier having a first supply node, the sense amplifier drawing charge from the first supply node to charge one of the bit lines;
- a common supply node that supplies charge to the plurality of sense amplifiers;
- a plurality of driver devices coupled between the common supply node and the sense amplifiers; and
- a charge storage device coupled to the common supply node.

14. The sensing scheme of claim 13, wherein:
the charge storage device includes a plurality of boost capacitors.

15. The sensing scheme of claim 14, wherein:
the memory cells are arranged in rows, each include a storage capacitor; and
the boost capacitors are arranged in a row that is generally parallel to the rows of memory cells.

16. The sensing scheme of claim 14, wherein:
the memory cells each include a storage capacitor having a storage plate and a first reference plate, the first reference plates of the storage capacitors being commonly coupled together; and
the boost capacitors each include a boost plate coupled to the common supply node, and a second reference plate, the second reference plates being commonly coupled to the first reference plates.

17. The sensing scheme of claim 16, wherein:
the first reference plates and second reference plates are portions of an integral plate structure.

18. The sensing scheme of claim 13, wherein:
each sense amplifier includes an insulated gate field effect transistor (IGFET) having a source-drain path that supplies charge to a bit line; and
each driver device includes an IGFET having a source-drain path coupled between the first supply nodes of one of the sense amplifiers and the common supply node.

19. The sensing scheme of claim 18, wherein:
each sense amplifier IGFET is a p-channel IGFET; and
each driver device IGFET is a p-channel IGFET.

20. The sensing scheme of claim 18, wherein:
each sense amplifier IGFET is an n-channel IGFET; and
each driver device IGFET is an n-channel IGFET.

* * * * *